United States Patent [19]

Peter

[11] Patent Number: 5,801,340

[45] Date of Patent: Sep. 1, 1998

[54] PROXIMITY SENSOR

[75] Inventor: Walter H. Peter, Hobart, N.Y.

[73] Assignee: Invotronics Manufacturing, Farmington Hills, Mich.

[21] Appl. No.: 496,561

[22] Filed: Jun. 29, 1995

[51] Int. Cl.[6] ................................................. G08C 21/00
[52] U.S. Cl. ............................. 178/19; 345/174; 341/33
[58] Field of Search ........................... 178/18, 19, 20; 345/173, 174; 341/33; 364/709.1, 709.11; 340/562, 679; 324/688

[56] References Cited

U.S. PATENT DOCUMENTS

| | | | |
|---|---|---|---|
| 3,504,236 | 3/1970 | Miyagawa et al. | 340/562 |
| 3,723,901 | 3/1973 | Nicolas | 340/562 |
| 3,764,819 | 10/1973 | Muller | 340/562 |
| 4,161,766 | 7/1979 | Castleberry et al. | 340/562 |
| 4,208,695 | 6/1980 | Noda et al. | 340/562 |
| 4,394,643 | 7/1983 | Williams | 340/562 |
| 4,430,645 | 2/1984 | Eskandry et al. | 340/562 |
| 4,449,122 | 5/1984 | Whitmer | 340/562 |
| 4,497,977 | 2/1985 | Saito et al. | 178/19 |
| 4,680,429 | 7/1987 | Murdock et al. | 178/19 |
| 4,684,931 | 8/1987 | Parks | 340/562 |
| 4,740,781 | 4/1988 | Brown | 345/174 |
| 4,743,895 | 5/1988 | Alexander | 345/174 |
| 4,806,709 | 2/1989 | Evans | 178/19 |
| 4,831,566 | 5/1989 | Mattews et al. | 178/20 |
| 4,884,061 | 11/1989 | Genevois | 340/562 |
| 4,910,504 | 3/1990 | Eriksson | 345/174 |
| 5,083,118 | 1/1992 | Kazama | 345/174 |
| 5,270,711 | 12/1993 | Knapp | 345/174 |
| 5,305,017 | 4/1994 | Gerpheide | 345/174 |
| 5,374,787 | 12/1994 | Miller et al. | 178/18 |
| 5,386,219 | 1/1995 | Greanias et al. | 345/174 |
| 5,486,847 | 1/1996 | Ranf et al. | 178/18 |

*Primary Examiner*—Curtis Kuntz
*Assistant Examiner*—Paul Loomis
*Attorney, Agent, or Firm*—Pennie & Edmonds,LLP

[57] ABSTRACT

An improved capacitive sensor for detecting the presence of objects in a sensing region. The sensor is a multilayer structure with alternating layer of condutive and insulating materials. The sensor structure has three electrodes: a touch plate, a guard layer, a ground plane, each of which are separated from each other by insulating layers. The sensor is operated by detection electronic circuitry which function in a either a self excited mode or an externally excited mode. This sensor is capable of detecting objects in a sensing region several feet away from the sensing surface and is particularly suitable for automobile applications, such as detecting potentially jamming objects in power (auto-closing) windows, doors, and the like.

25 Claims, 15 Drawing Sheets

PROXIMITY SENSOR

BACKGROUND OF THE INVENTION

The present invention relates to a sensor with associated detection circuitry for detecting the presence of objects in a sensing region. More particularly, the present invention relates to a proximity sensor utilizing capacitive effects to detect the presence of an object in applications such as automobile auto-closing windows, auto-closing sun roofs, automatic sliding doors, trunk pull-down mechanisms and other closing or actuator mechanisms and thus prevent the object from being pinched by the closing mechanism.

Devices for detecting the presence or absence of objects have been available for several years for various applications. In the manufacturing industry, sensors have been used to detect objects along an assembly line. Security systems for both home and commercial applications use sensors for detecting the presence of intruders.

Prior art sensors employ either optical electromagnetic radiation or magnetic sensing means to detect an object. Optical sensors use either the interruption or reflection of light to detect the presence of an object in a preselected region. One example is a photoelectric transceiver which emits light into a region, and if there is an object in this region the emitted light is reflected off the object. The transceiver then senses the light that is reflected back and provides an output indicating that an object is present. Sensors relying on magnetic effects may be used to detect objects that are magnetic in nature. Microwave or radio frequency (RF) sensors are responsive to the changes in the standing wave pattern surrounding a microwave source caused by the interference between microwaves reflected from an object and the directly radiated microwave signal.

Each of the above mentioned types of proximity sensors have several drawbacks when used in industrial, automotive or other harsh environment applications. For example, the performance and sensitivity of optical sensors are affected by dirt and grime accumulation around car windows and doors, and hence sensing areas/surfaces may need to be kept clean by the automobile owner. In addition, optical sensing requires an unobstructed area since the sensing is inherently local to the optical source. Microwave sensors are often incompatible with the strict limits on electromagnetic interference required in automobiles in order to prevent interference with other car electronics, radios, cellular phones and the like. This interference problem is exacerbated if a number of microwave sensors are installed in a single automobile. Magnetic sensors are not useful to detect objects that are nonmagnetic, such as humans or pets near windows and doors of an automobile. Ultrasonic sensors typically need additional modifications to localize and limit their detection range which can prove expensive.

By comparison, proximity sensors utilizing changes in capacitance do not suffer from the drawbacks mentioned above. However, prior art capacitance-type sensors are typically not very sensitive and are thus incapable of detecting objects that cause changes in capacitance of the order of a few picofarads (pF). This invention overcomes these limitations and provides a sensitive, capacitive-effect sensor capable of detecting objects several feet away from the sensing surface and is particularly suitable for automotive applications.

SUMMARY OF THE INVENTION

This invention provides an improved capacitive sensor implemented using a novel multilayer sensor structure. This sensor is capable of detecting objects in a sensing region several feet away from the sensing surface and is particularly suitable for automobile applications, such as detecting potentially jamming objects in power (auto-closing) windows, doors, sun-roofs, sliding doors, trunk pull-down mechanisms and the like.

The sensor is a multilayer structure comprising alternating layers of conductive and dielectric (insulating) materials. The sensor structure has three electrodes: a touch plate, a guard layer, and a ground plane, each of which are separated from each other by insulating layers. The guard layer is used in conjunction with detection electronic circuitry to electrically isolate the touch plate from the ground plane. If the guard layer electrode is driven by a signal identical in amplitude and phase to the voltage imposed on the touch plate, there will be no capacitive effect between the touch plate and the guard electrode or the touch plate and ground. When an object is within the sensing region, its presence causes an additional capacitance to be introduced in parallel to the sensor capacitance (which can be as low as 1 pF) and this causes a change in the output voltage of the sensor. Since the sensor capacitance itself is very low, an object whose presence results in a capacitance of around 0.01 pF between itself and the touch plate can be detected.

It is the addition of the guard electrode, and driving this guard electrode with a signal identical to, but isolated from, the signal imposed on the touch plate that greatly increases the sensor sensitivity.

The sensor is operated by electronic detection circuitry which functions in a either a self-excited mode or an externally excited mode.

In the self excited mode the sensor structure is itself an active component of a oscillator and objects in proximity to the touch plate cause a change in the amplitude and/or frequency of the oscillator.

In the externally excited mode, an AC signal is applied from an external source to the sensor, and changes in amplitude and/or phase caused by objects in proximity to the sensor are detected.

The features and advantages of this invention will become more apparent when reading the following description and claims in conjunction with the accompanying drawings.

BRIEF DESCRIPTION OF THE DRAWINGS

FIG. 3(a) is a block diagram schematic representation of the circuit shown in FIG. 3(b).

FIG. 4(a) is a block diagram schematic representation of the circuit shown in FIG. 4(b).

FIG. 6(a) is a block diagram schematic representation of the circuit shown in FIG. 6(b).

FIG. 7(a) is a block diagram schematic representation of the circuit shown in FIGS. 7(b)&(c).

DETAILED DESCRIPTION OF THE PREFERRED EMBODIMENTS

Figure 1:
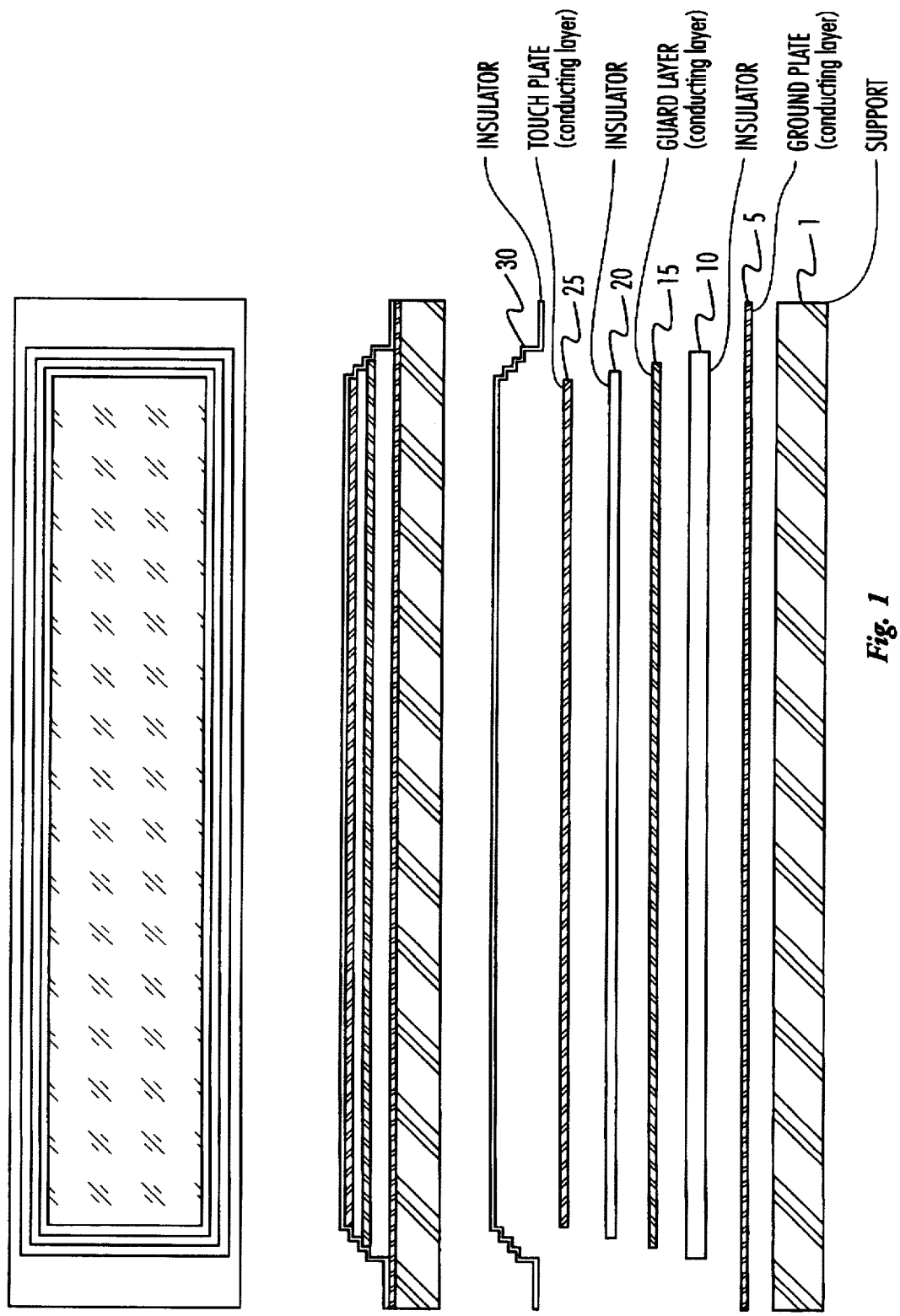
FIG. 1 shows a multilayer sensor structure formed in accordance with the invention for detecting the presence of objects in a region surrounding this sensor structure.

FIG. 1 shows a multilayer sensor structure formed in accordance with the invention for detecting the presence of objects in a region proximal to that structure. The sensor is a multilayer structure comprising alternating layers of conductive and dielectric (insulating) materials. The ground plane 5 is a conductive layer that rests on a suitable support surface to provide a stable ground plane 5 for the guard layer 15 and the touch plate 25. Alternatively, the support surface 1 may itself serve as a suitable ground plane 5, as in the case of the sheetmetal body in a vehicle. The ground plane 5 must be at least as large as the guard layer 15, but may extend beyond it in all dimensions. A first insulating layer 10 is placed over the guard plane 5 and must be at least as large as the guard layer 15, but may extend beyond it. The guard layer 15 is a conductive layer that is placed over the first insulating layer 10. The guard layer 15 is used in conjunction with the detection electronic circuitry to electrically isolate the touch plate 25 from the ground plane 5. The guard layer 15 should, for this preferred embodiment, be the same size as, and in registration with, the touch plate 25. In practice, the guard layer 15 may extend slightly (typically 10/1000th of an inch) beyond the touch plate 25 to allow for fabrication tolerances and to facilitate ease of assembly. The guard layer 15 is covered by a second insulating layer 20. The touch plate 25, which is the active sensing area, is placed above the second insulating layer 20. It is important to note that actual touching of the touch plate 25 is not required for sensing, and that depending on the type, and therefore sensitivity, of the detection circuitry used, sensing can range from several feet beyond the sensing area to physically touching the sensor structure. A protective insulating layer 30 is placed over the touch plate 25, but this is a design option that is not required for operation of the sensor.

The touch plate 25 and the overall sensor structure is not limited in its dimensions or shape, and can be curved, bent, circular or angular. In an automotive power window application the sensor structure takes the form of a long, narrow strip mounted on the weather seal at the top of the window. The sensor structure may be mounted on the inside or outside, or both sides of an automobile door or window.

A broad range of materials are suitable for both the conducting and insulating layers. Copper, steel or aluminum are desirable choices for the conducting layers. Conductive ink, conductive epoxy, or a transparent coating of indium/tin oxide are also suitable choices for the conducting layers. Most common non-conductive plastics, epoxy, adhesives, aluminum oxide, and glass are suitable materials for the insulating layers. Of the plastics, styrene and polyethylene are desirable choices for the insulating layers. It is important to note that the choice of materials is governed more by compatibility with the particular application environment for the sensor than by any requirements intrinsic to the sensor structure itself.

Electrical connections are made to the touch plate 25, the guard layer 15, and the ground plane 5. For each conducting layer of the sensor, i.e., the ground plane, the guard layer and the touch plate, a tab or an extension is brought out in order to enable electrical connections to be made to the individual layers. Typically, the extension for the ground plane is the longest, the extension for the guard layer is shorter than that for the ground plane, and the extension for the touch plate is the shortest. Lead wires can then be conventionally soldered to the extensions for the individual layers. Alternatively, mechanical connectors can be used to make contact to the extensions for each layer. The sensor is operated by electronic detection circuitry, described below, which functions in a either a self-excited mode or an externally excited mode. In the self excited mode the sensor structure is itself an active component of an oscillator and objects in proximity to the touch plate 25 cause a change in the amplitude and/or frequency of the oscillator. In the externally excited mode, an AC signal is applied from an external source to the sensor, and changes in amplitude and/or phase caused by objects in proximity to the sensor are detected.

Figure 2B:
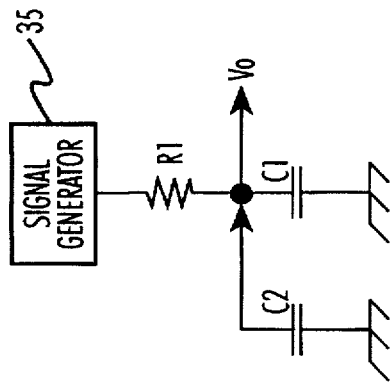
FIG. 2(b) shows the capacitive sensor in FIG. 2(a) and the presence of an object in the sensing region is manifested by an additional capacitance, C2. C2 is parallel to C1, and therefore, they can be added together to form a larger equivalent capacitance.
Figure 2D:
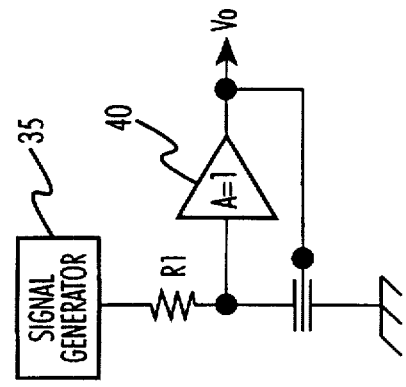
FIG. 2(d) shows a unity gain, non-inverting amplifier being used to drive the guard electrode layer of the circuit in FIG. 2(c). The touch plate and guard electrode are electronically isolated, and they may still be driven by voltages that are equal in phase and amplitude.
Figure 2A:
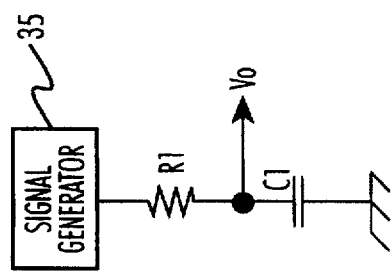
FIG. 2(a) shows a simple touch plate capacitive sensor.

The invention, its key advantages and features, is best understood by first examining the operation of a simple touch plate 25 capacitive sensor. FIG. 2(a) shows a simple touch plate 25 capacitive sensor. The touch plate 25 and ground form a capacitor, C1, as shown schematically in FIG. 2(a). The capacitance C1 for this example is between 100–200 pF. An AC voltage from an oscillator 35 is applied to the touch plate 25 through a large value resistor, R1. The value of R1 is about equal to the capacitive reactance of C1 at the oscillator's frequency. Therefore, R1 and C1 form an AC voltage divider where the output $V_o$ in FIG. 2(a) is given by:

$$V_o = V_g [X_{C1}/(X_{C1}+R1)]$$

where $X_{C1}$ is the capacitive reactance of C1 and $V_g$ is the voltage applied by the signal generator 35. Therefore, in simple terms, the output voltage, $V_o$, is inversely proportional to C1. In FIG. 2(b) an object whose presence is to be detected by the sensor is schematically shown by a capacitance, C2. C2 is parallel to C1, and therefore, they can be added together to form a larger equivalent capacitance. As seen by the equation shown above, this larger equivalent capacitance causes a drop in the output voltage, $V_o$. It is this decrease in the output voltage, $V_o$ due the additional capacitance brought about by the presence of an object that is detected by the subsequent detection circuitry.

In practical devices C1 (of the order of a 100 pF) is much larger than C2 (around 10 pF), and therefore, the resulting in the output voltage, $V_o$, is very small. In addition, C1 is not stable with temperature, humidity, and aging. Compensating for these effects and increasing sensitivity makes the circuits more complicated and expensive.

Figure 2C:
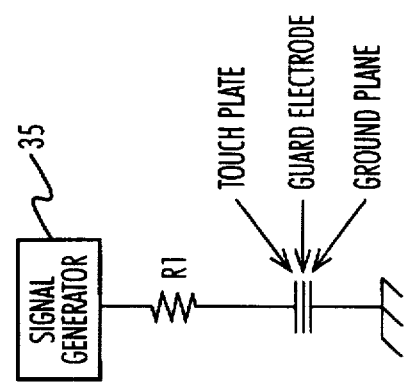
FIG. 2(c) shows addition of a third element, a guard electrode, to the touch plate capacitive sensor of FIG. 2(a).

This present invention is based on the principle that although capacitance cannot be eliminated, it can be effectively canceled out. FIG. 2(c) shows addition of a third element to the touch plate 25 capacitive sensor, a guard electrode 15. If the guard electrode 15 is driven by a signal identical in amplitude and phase to the voltage being imposed on the touch plate 25, there will be no capacitive effect between the touch plate 25 and the guard electrode 15 or the touch plate 25 and ground.

In order to achieve this cancellation, the touch plate 25 cannot be directly tied to the guard electrode 15, because this would put the circuit in FIG. 2(c) back to the same configuration shown in FIG. 2(a). But if a buffer amplifier is used to drive the guard electrode 15, the touch plate 25 and guard electrode 15 are electronically isolated, and they may still be driven by voltages that are equal in phase and amplitude. This resulting circuit is shown in FIG. 2(d). The buffer amplifier is, typically, a non-inverting amplifier with approximately unity gain. Preferably, the unity gain amplifier 40 in FIG. 2(d) has a very high input impedance and a very low output impedance. In practice, the capacitance between the guard electrode 15 and ground cancels out the capacitance between the touch plate 25 and ground, C1.

It is the addition of the guard electrode 15, and driving this guard electrode 15 with a signal identical to, but isolated from, the signal imposed on the touch plate 25 that greatly increases the sensor sensitivity.

For optimum cancellation effect the dimensions of the guard electrode 15 must be geometrically coincident with the touch plate 25. That is the guard electrode 15 must completely mask the touch plate 25 from the ground plane 5. However, the guard electrode 15 need not be at an equal distance from the touch plate 25 at all points. If the guard electrode 15 extends beyond the touch plate 25 the guard electrode's effect will extend to the object being sensed, thus reducing overall sensitivity. As mentioned above, in practice the guard is made slightly larger than the touch plate 25 to allow for fabrication tolerances.

With careful mechanical construction of the sensor structure and the buffer amplifier circuit for achieve optimum cancellation effect, equivalent values of touch plate 25 to ground plane 5 capacitance of less than 1 pF can be readily achieved. If the detection circuits are designed to detect a 1% drop in the output voltage, $V_o$, that would then require a capacitance of less than 0.01 pF between the touch plate 25 and the object whose presence is to be sensed. Therefore, an object whose presence results in a capacitance of around 0.01 pF between itself and the touch plate 25 can be detected. For practical sensors designed in accordance with this invention, a output voltage drop of 20% at $V_o$ will result from the very lightest touch of a finger to the sensor.

In FIG. 2(d) the output voltage, $V_o$, is an AC voltage superimposed on a DC bias voltage. The DC bias voltage is of no interest and is typically removed by a blocking capacitor. The AC voltage is rectified, filtered, and amplified by detection electronics to a useful and convenient DC voltage. This output DC voltage is proportional to the peak AC voltage input.

The basic principle of this invention as illustrated in FIG. 2(d) can be implemented in different embodiments of this invention. As will be apparent from the following description, any particular embodiment may be chosen depending on the cost/performance tradeoffs involved in any particular application. The sensor is operated by electronic detection circuitry which functions in either a self excited mode or an externally excited mode. The externally excited detection circuitry use either amplitude and phase comparison or amplitude comparison only to detect the presence of an object in the sensing region. The self excited detection circuitry use either amplitude comparison or frequency comparison to detect the presence of an object in the sensing region. Each of these different embodiments will be described in greater detail below.

Figure 3A:
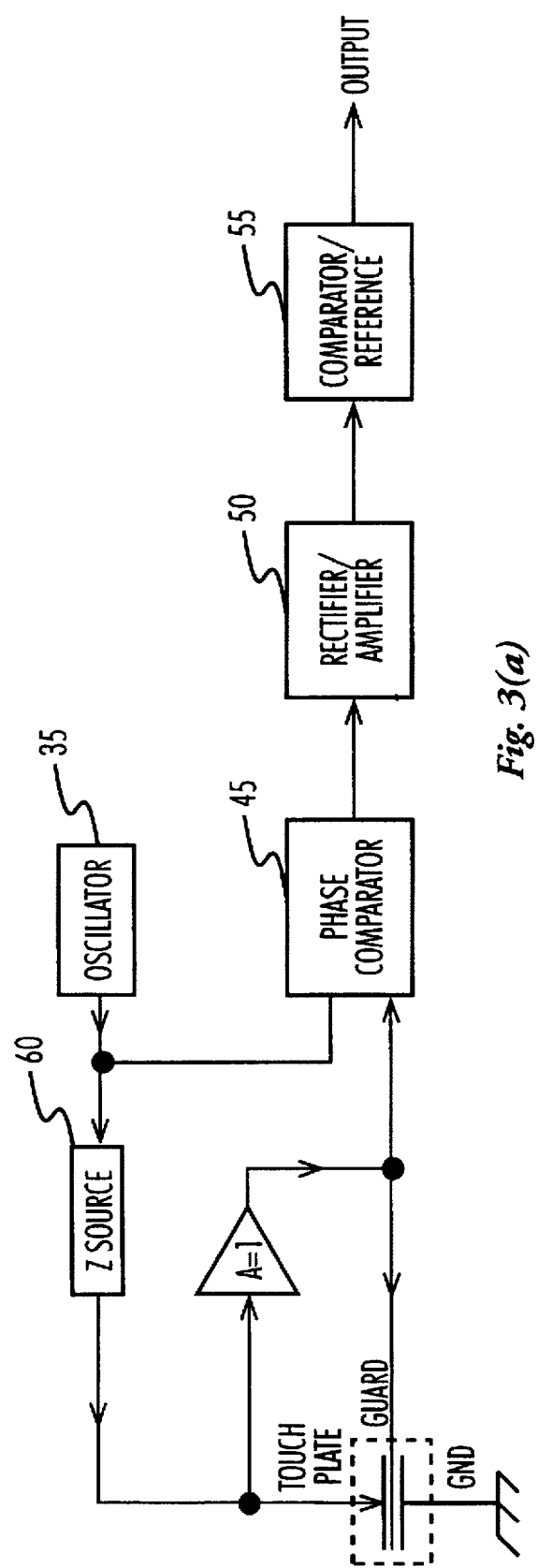
FIGS. 3(a) & (b) show an externally excited sensor with detection electronic circuitry that uses both amplitude and phase comparison.
Figure 3B:
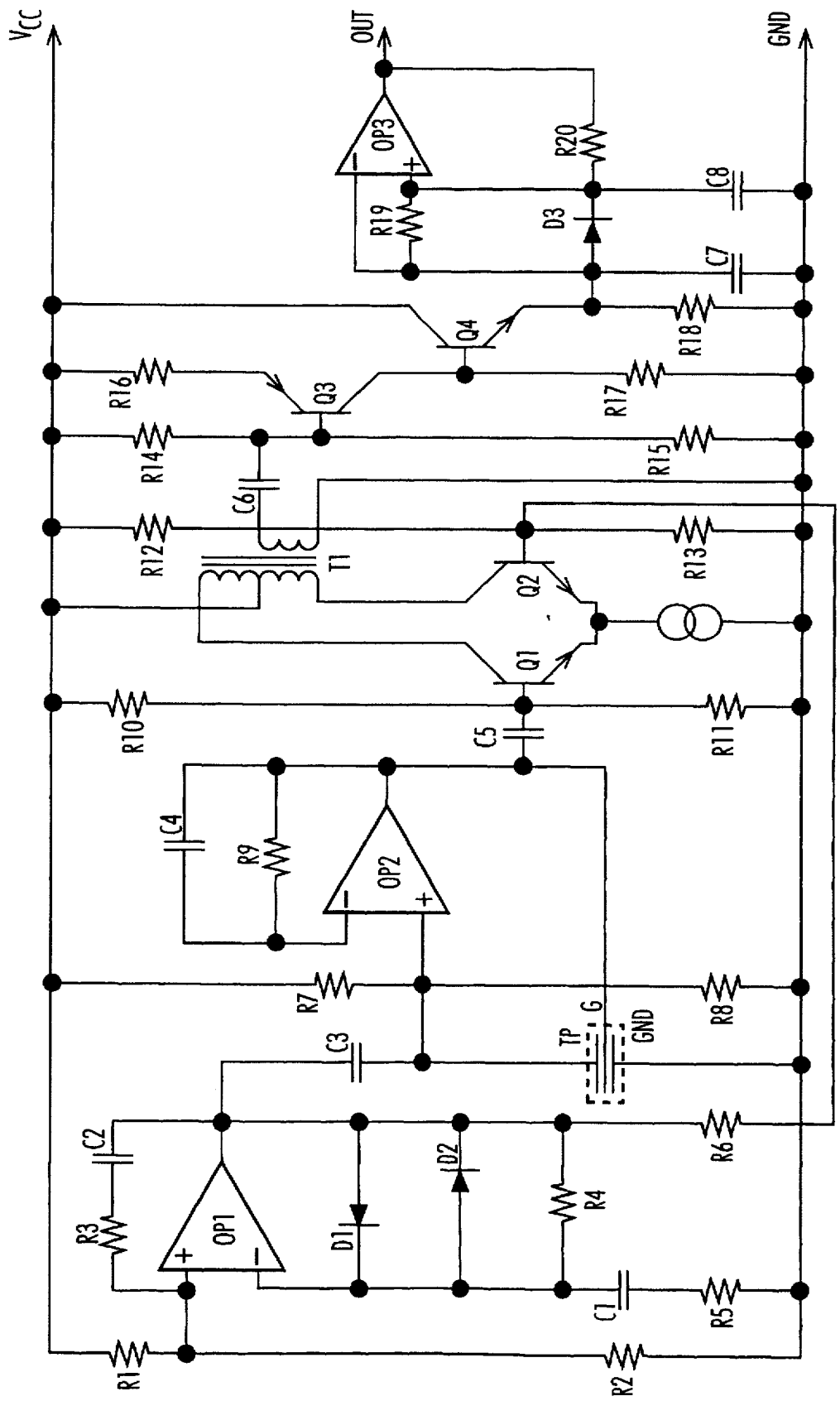

The externally excited proximity sensor is shown in FIGS. 3 & 4. FIGS. 3(a) & (b) show an externally excited sensor with detection electronic circuitry that uses both amplitude and phase comparison. FIG. 3(a) is a block diagram schematic representation of the circuit shown in FIG. 3(b). The touch plate 25 is driven by an external oscillator 35 through a high impedance current limiter 60. The unity gain buffer amplifier 40 drives the guard electrode 15 with a signal as to optimally cancel the sum of the capacitance between the touch plate 25 and ground and the input capacitance of the buffer amplifier 40. This arrangement in FIG. 3(a) is identical to the arrangement in FIG. 2(d) described earlier.

The output voltage of the buffer amplifier 40, as described earlier, is an AC signal, at the oscillator frequency, superimposed on a DC bias level. This output AC signal and the signal from the oscillator 35 is presented to a phase comparator 45. If there is no object near the sensor the output AC signal is in phase with the signal oscillator. As an object approaches the sensor the output AC signal shifts in phase, with little change in amplitude, until it lags by 90 degrees with the phase of the signal oscillator 35. As the object gets closer the amplitude of the output AC signal decreases rapidly with little change in phase. The rectifier/amplifier 50 removes the DC bias level from the output voltage signal, and then amplifies and converts the output AC signal to a DC signal. This rectified DC signal is compared to a floating reference at the comparator/reference stage 55. The output from the comparator/reference 55 is a logical "1" if the object is beyond a predetermined distance, or "0" if it is closer.

FIG. 3(b) shows a circuit diagram of an externally excited sensor with amplitude and phase comparison corresponding to the block diagram representation in FIG. 3(a). Operational amplifier, OP1, with resistors R1 through R5, diodes D1 and D2, and capacitors C1 and C2 form a sinusoidal (sine) wave oscillator whose output is fed through a current limiting, high impedance capacitor, C3, to the touch plate 25. Although a sine wave oscillator is shown in FIG. 3(b), square, triangular, or ramp waveform generators may also be employed. The Z source 60 is a capacitor C3 in FIG. 3(b) but high impedance resistors or inductors could be used in their place. Operational amplifier, OP2 with capacitor C4 and resistors R7, R8, and R9 form a unity gain, buffer amplifier that drives the guard electrode 15. Capacitor C5 is a DC blocking capacitor. The output from the sine wave oscillator is fed to transistor Q2 and the output AC signal from the buffer amplifier is fed to transistor Q1. Resistors R10 through R13, transistors Q1 and Q2, and coupling transformer T1 form a phase comparator circuit. Capacitor C6 is a DC blocking capacitor that removes the DC bias level from the AC output. The output from the coupling transformer T1 is applied to the rectifier/amplifier 50. Transistors Q3 and Q4 together with resistors R14 through R18 and capacitor C7 form a rectifier/amplifier circuit. The output of the rectifier/amplifier from transistor Q4 is a DC voltage proportional to the peak AC voltage input from capacitor C6. This DC signal is compared to a floating reference by the comparator/reference circuit.

Figure 5B:
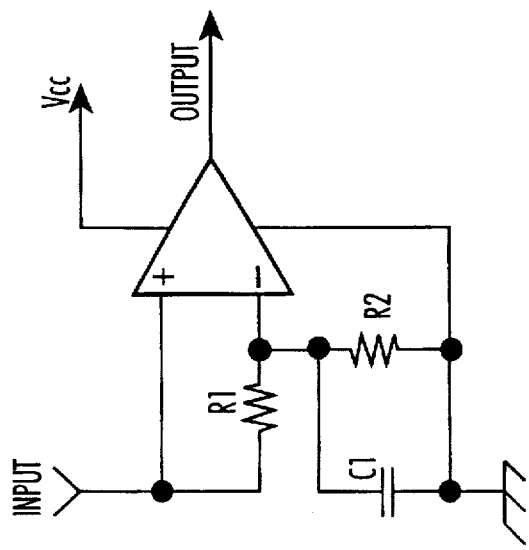
FIGS. 5(a)–(c) show three different implementations of a comparator/reference circuit that can be used in the detection circuitry.
Figure 5C:
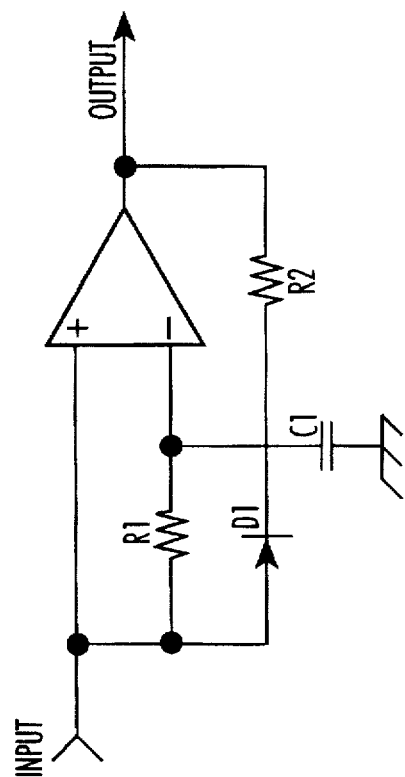
Figure 5A:
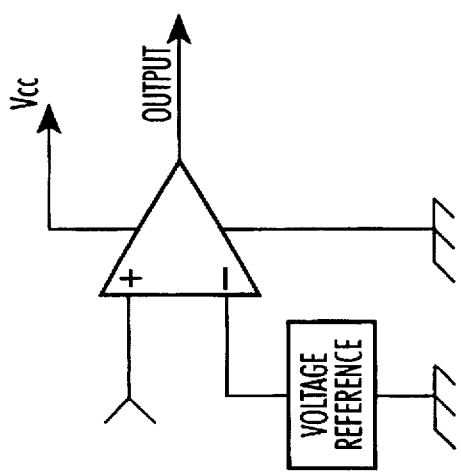

There are several ways to implement a comparator/reference circuit and three different versions are shown in FIG. 5(a)–(c). The simplest implementation is shown in FIG. 5(a). The DC voltage from the rectifier/amplifier is applied to the non-inverting input (the '+' input) of a comparator. A DC reference voltage is applied to the inverting input (the '−' input). If the DC sensor voltage drops below the reference voltage, the comparator output voltage will switch from the supply voltage, $V_{cc}$, to ground. The reference voltage must be set to a value lower than the sensor DC voltage with no object being sensed. The closer the reference voltage is to the DC sensor voltage the greater the sensitivity. The disadvantages of this circuit are that keeping the sensor voltage stable with changes in temperature, humidity, ageing and dirt requires the use of expensive materials and tight tolerance components.

To overcome these long term drift effects a comparator with a "floating reference" may be used. In FIG. 5(b) the DC sensor voltage is applied to the comparator non-inverting input. The reference voltage is derived from the DC sensor voltage by a divider consisting of resistors R1 and R2, where R2 >> R1. The value of the capacitor C1 in FIG. 5(b) is selected to have a time constant of several seconds to a minute with resistor R1. When no object is being sensed, C1 and the comparator input will charge to a value slightly less than the DC sensor voltage as determined by the resistive divider ratio. The reference voltage self-adjusts to sensor output voltage variations caused by component tolerances and long term drift effects that change more slowly than the time constant (R1*C1). If an object approaches the sensor, the DC sensor voltage will drop, but the reference voltage will be maintained by the capacitor C1. If the drop is below the reference the comparator output will switch from the supply voltage $V_{cc}$ to ground. If the sensed object remains in position for several seconds the reference voltage will decay to a new value slightly lower than the sensor voltage, and the comparator output will switch back to $V_{cc}$.

In automotive applications it is desirable for the comparator output to stay active for as long as the sensed object is within the sensing range, and for the reference voltage recover rapidly from an active value. The comparator/reference circuit in FIG. 5(c) fulfills these additional requirements.

In this circuit an operational amplifier is used as a comparator because an active pull-up of the output is required. Here the DC sensor output is applied directly to the inverting input. Circuit elements R1, D1, and C1 form an RC network with a long discharge time (through R1) and a short charge time (through D1). Resistor R2 is connected to the comparator output and provides hysteresis to the reference voltage. When no object is being sensed the output of the comparator is at ground, and the divider R1 R2 holds the non-inverting input slightly below the inverting input. When an object is in range the inverting input will fall below the reference voltage, and the output will switch to the supply voltage $V_{cc}$. The R1 R2 resistor combination now pulls the reference voltage above the sensor voltage latching the output at $V_{cc}$. When the object is out of range the sensor voltage again rises above the reference voltage, and the output voltage then returns to ground. For the circuits shown in FIGS. 5(b) and (c) the various RC time constants and resistor divider ratios can be varied to meet the needs of any particular application for the sensor.

In FIG. 3(b) the particular comparator/reference circuit shown corresponds to the in FIG. 5(c). The comparator/reference circuit uses an operational amplifier OP3 with circuit elements R19, R20, D3, and C8 and circuit operation is similar to the circuit described above for FIG. 5(c).

Figure 4A:
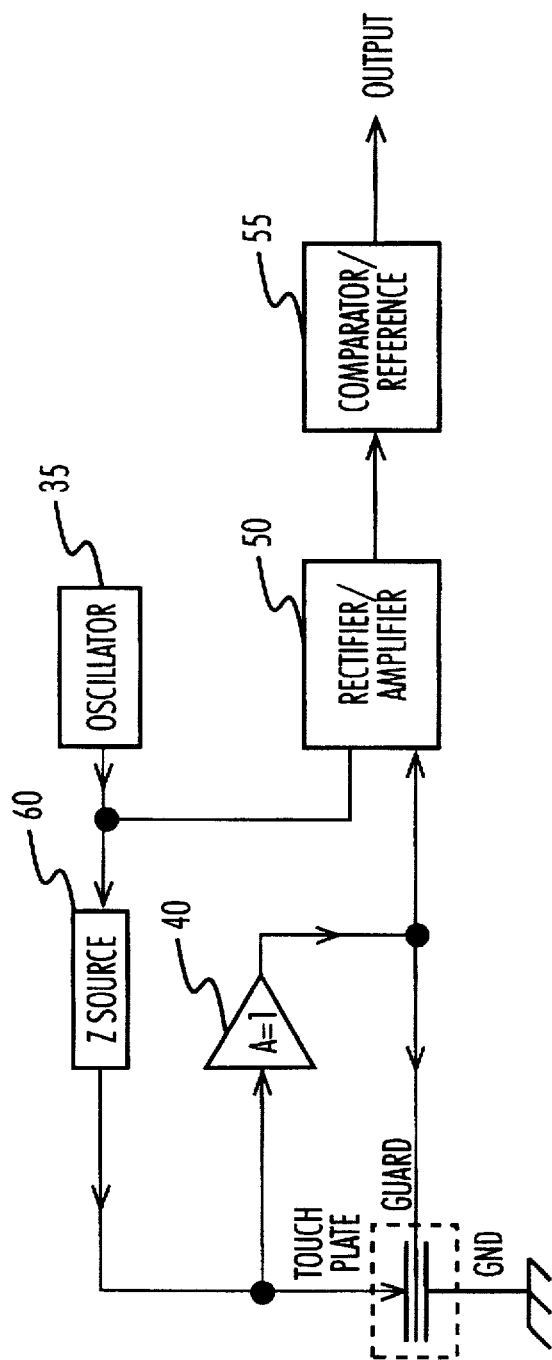
FIGS. 4(a) & (b) show an externally excited sensor with detection electronic circuitry that uses amplitude comparison.

FIGS. 4(a) & (b) show an externally excited sensor with detection electronic circuitry that uses amplitude comparison. FIG. 4(a) is a block diagram schematic representation of the circuit shown in FIG. 4(b). FIG. 4(a) is identical to FIG. 3(a) with the exception that phase comparison is not used for signal detection circuit in FIG. 4(a), and hence the phase comparison circuit block 45 is missing in FIG. 4(a).

Figure 4B:
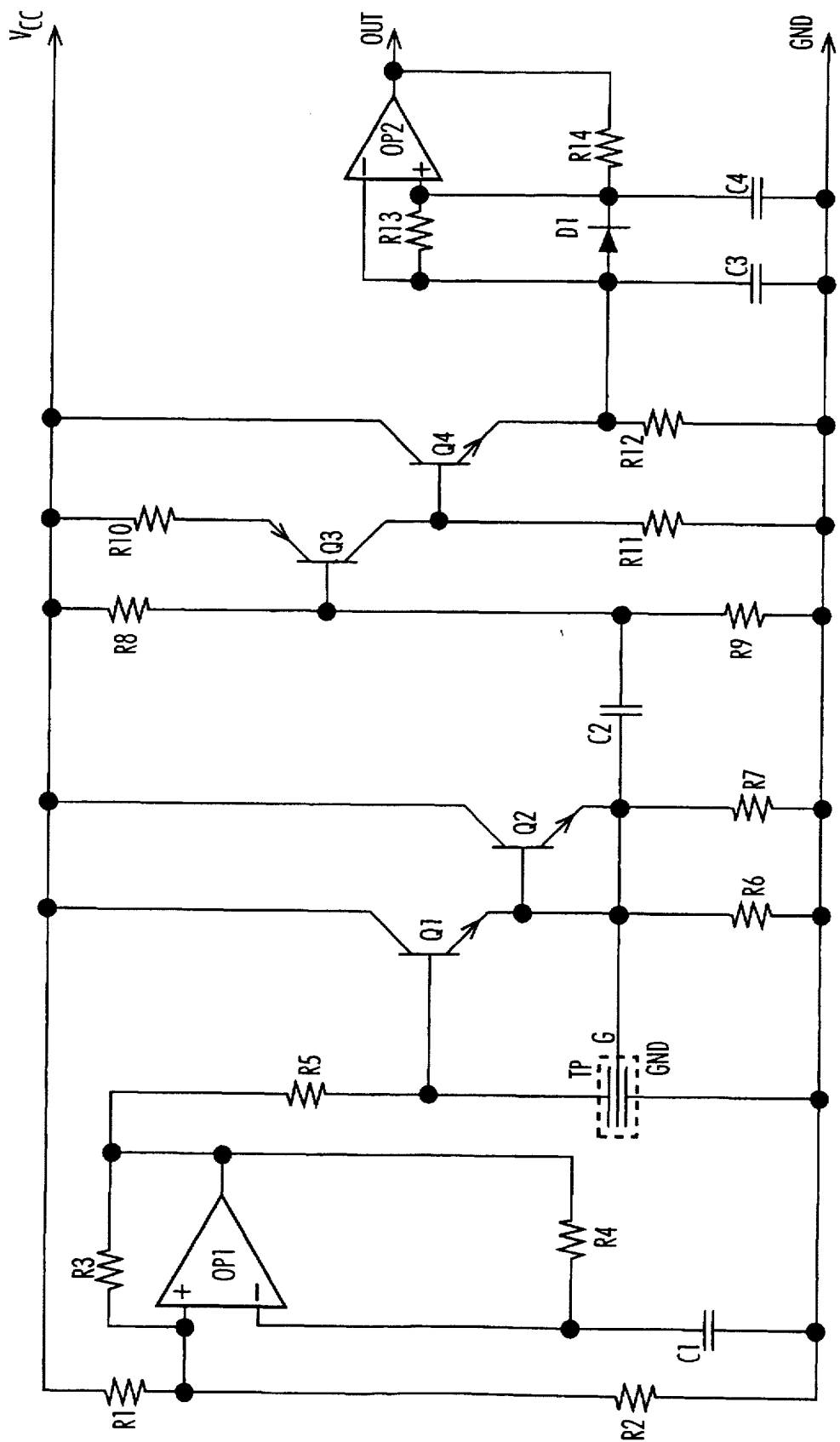

FIG. 4(b) shows a circuit level implementation of an externally excited sensor with amplitude comparison corresponding to the block diagram shown in FIG. 4(a). Circuit operation is similar to that described above for the circuit shown in FIG. 3(b) with the exception that the output of the buffer amplifier is fed directly to the rectifier/ amplifier circuit without the intervening phase comparison circuitry. The oscillator shown in FIG. 4(b) comprising operational amplifier, OP1, resistors R1 through R4, and capacitor C1 generates a square waveform as opposed to the oscillator shown in FIG. 3(b) which generates a sinusoidal waveform. A different oscillator circuit is shown in FIG. 4(b) for illustration purposes only. Both types of oscillator circuits may be used interchangeably in FIGS. 3(b) and 4(b). Similarly, for illustration purposes, a resistor R5 in FIG. 4(b) serves as the high impedance, current limiting Z source. An alternate example was illustrated in FIG. 3(b) where a capacitor C3 was used as the Z source. The buffer amplifier in FIG. 4(b) is formed by transistors Q1 and Q2 in a Darlington emitter-follower configuration and by resistors R6 and R7. This buffer amplifier is a cheaper way to implement a buffer amplifier compared to the operational amplifier version shown in FIG. 3(b). However, the buffer amplifier in FIG. 3(b) using an operational amplifier provides higher sensitivity and closer to unity gain compared to the buffer amplifier shown in FIG. 4(b). In any embodiment that uses either amplitude and phase comparison (as in FIG. 3(b)) or amplitude comparison only (as shown in FIG. 4(b)) either buffer amplifier may be employed depending upon the cost/performance tradeoffs in any particular application. The capacitor C2 in FIG. 4(b) provides DC blocking. The rectifier/amplifier comprising resistors R8 through R12, capacitor C3 and transistors Q3 and Q4 is identical in design and operation to the rectifier/amplifier circuit shown in FIG. 3(b). The comparator/reference circuit in FIG. 4(b) is also identical in design and operation to the circuit shown in FIG. 3(b).

The circuit shown in FIG. 4(b) uses only amplitude comparison detection circuitry and does not utilize the phase shift component of the AC output signal from the buffer amplifier. This circuit is therefore less sensitive than the device shown in FIG. 3(b). It is, however, a cheaper implementation because it does not contain the phase comparison circuit elements.

The sensor structure may also be operated with electronic detection circuitry which functions in a self excited mode. In the self excited mode the sensor structure is itself an active component of an oscillator. The mechanical layout of the sensor structure (see FIG. 1) makes two capacitors, one between the touch plate 25 and guard electrode 15 and the other between the guard electrode 15 to ground. The two capacitors have a common connection at the guard electrode 15, and these capacitors can be incorporated to provide feedback and to serve as frequency determining components (which resonate with an inductor) in a Colpitts oscillator. When an object approaches the touch plate 25 operating with self excited detection circuitry the output frequency and amplitude decreases. Detection circuits are designed to detect these changes in amplitude and frequency, and thereby indicate the presence of an object in the sensing region.

Figure 6A:
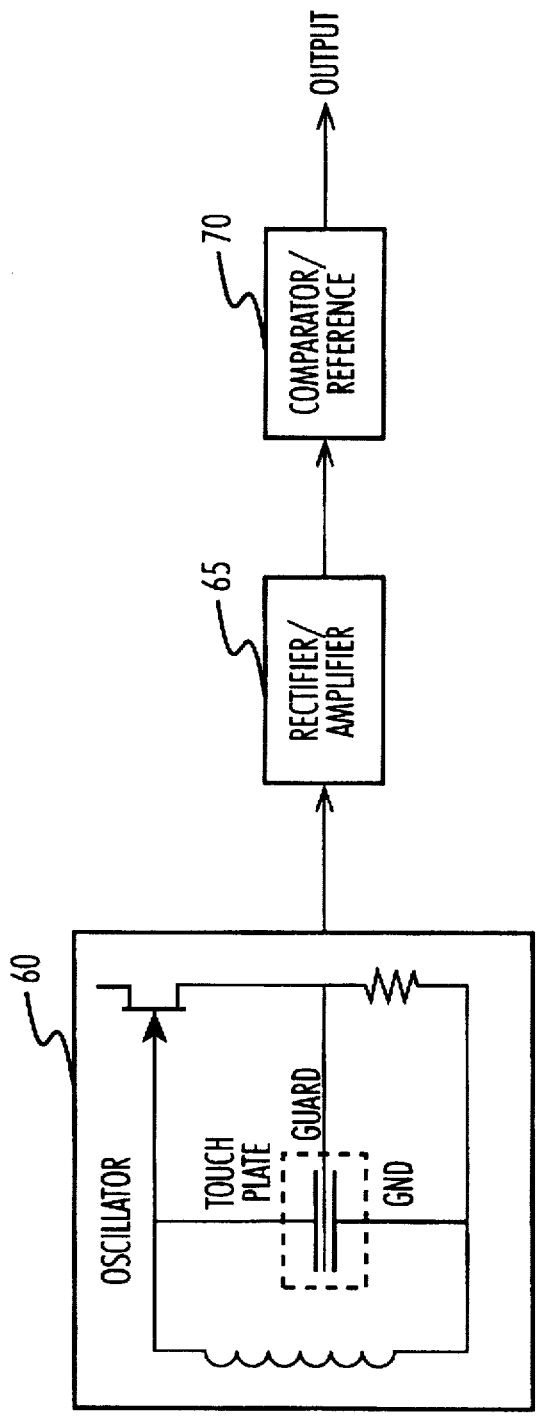
FIGS. 6(a) & (b) show a self excited sensor structure using amplitude comparison detection circuitry (without utilizing the change in frequency in the AC output signal from the buffer amplifier).
Figure 6B:
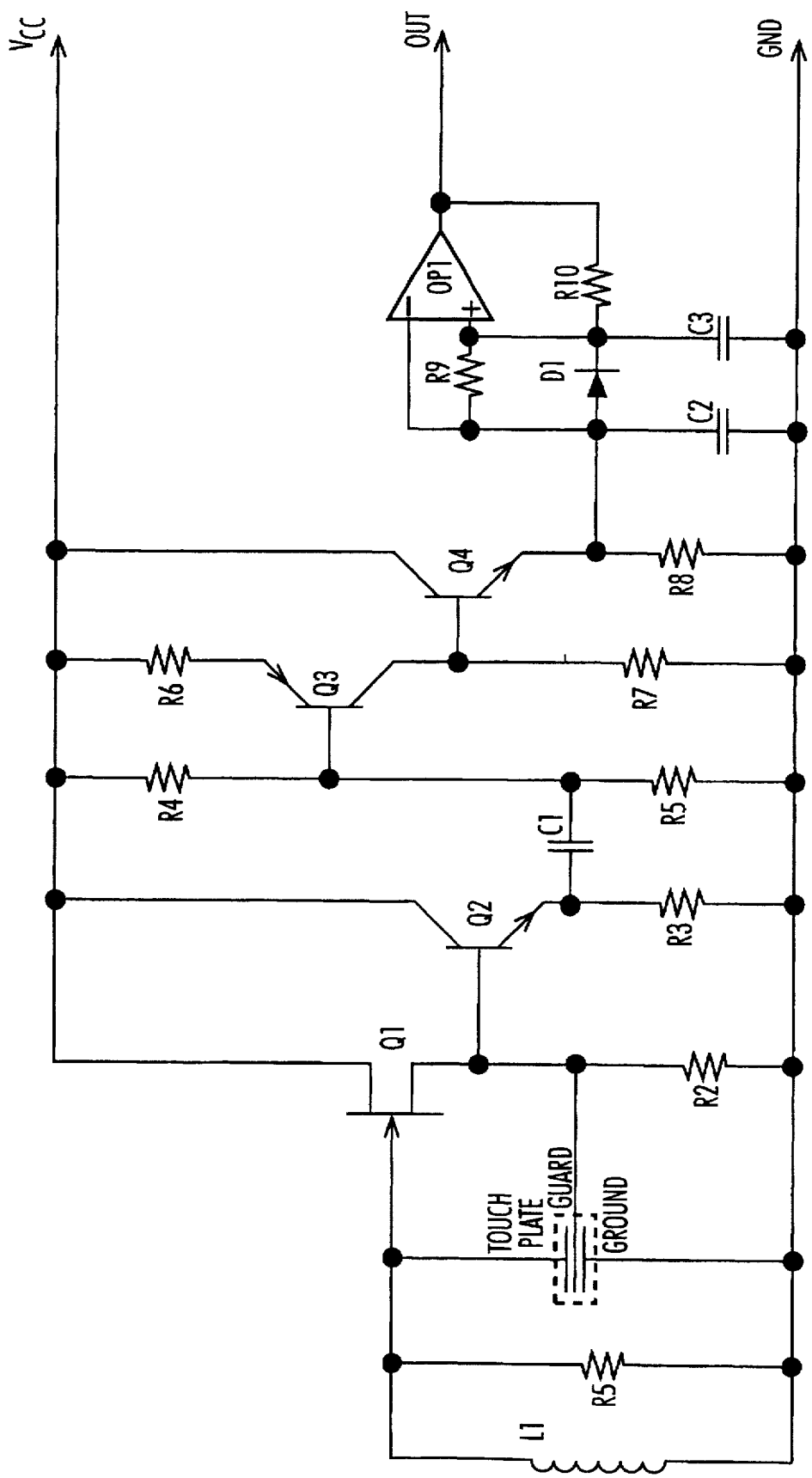

FIGS. 6(a) & (b) illustrate a self excited sensor structure using amplitude comparison detection circuitry (without utilizing the change in frequency in the AC output signal from the buffer amplifier). FIG. 6(a) is a schematic block diagram showing three functional circuit blocks: an oscillator, a rectifier/amplifier and a comparator/reference. FIG. 6(b) is a circuit level implementation of the schematic shown in FIG. 6(a). Transistor Q1 is the oscillator's active component, and inductor L1 together with the back-to-back sensor capacitors determine the frequency of oscillation. R1 and R2 are the biasing resistors for transistor Q1. Transistor Q2 and resistor R3 form a buffer amplifier to isolate the oscillator from the subsequent circuits. Capacitor C1 is a DC blocking capacitor. The AC output signal from C1 is fed to a rectifier/amplifier circuit (comprises circuit elements Q3, Q4, R4 through R8, and C2) which is identical in design and operation to the rectifier/amplifier circuit seen in FIGS. 3(b) and 4(b). The output from this circuit is fed to a comparator/reference circuit which is identical in design and operation to the comparator/reference circuit seen in FIGS. 3(b) and 4(b).

Figure 7A:
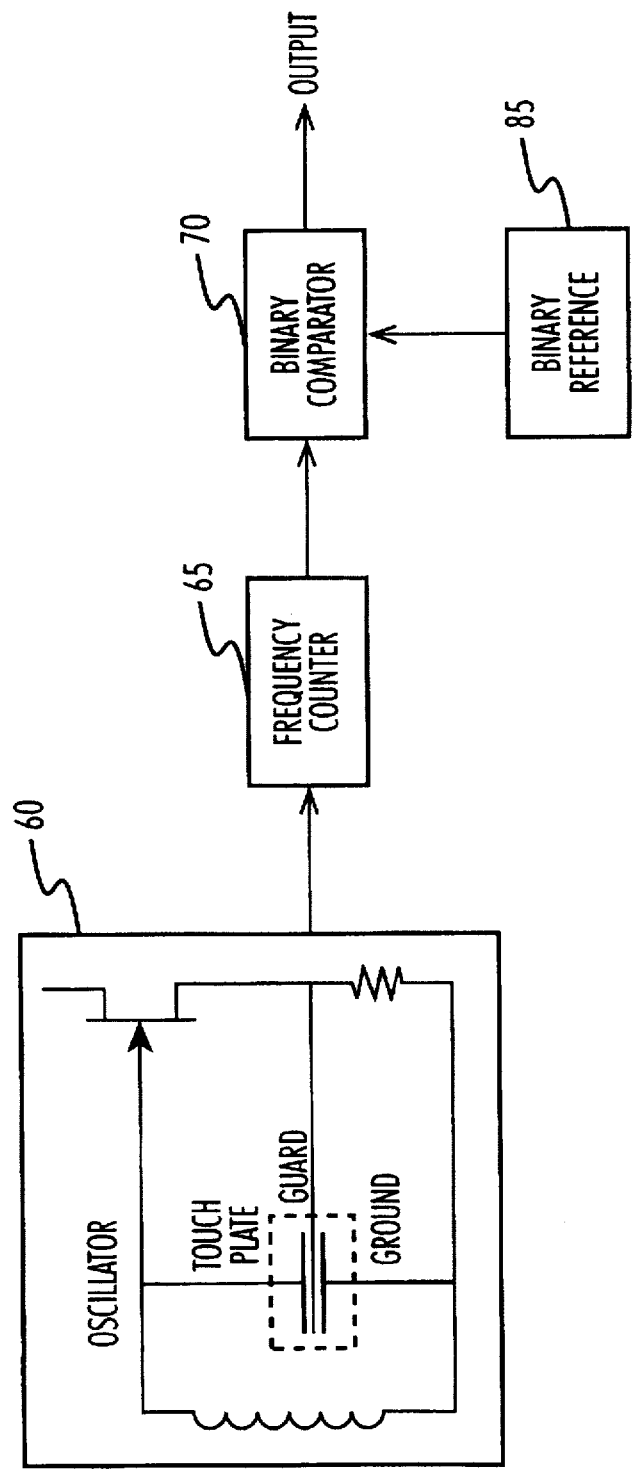
FIGS. 7(a)–(d) show a self excited sensor structure using frequency comparison detection circuitry.
Figure 7B:
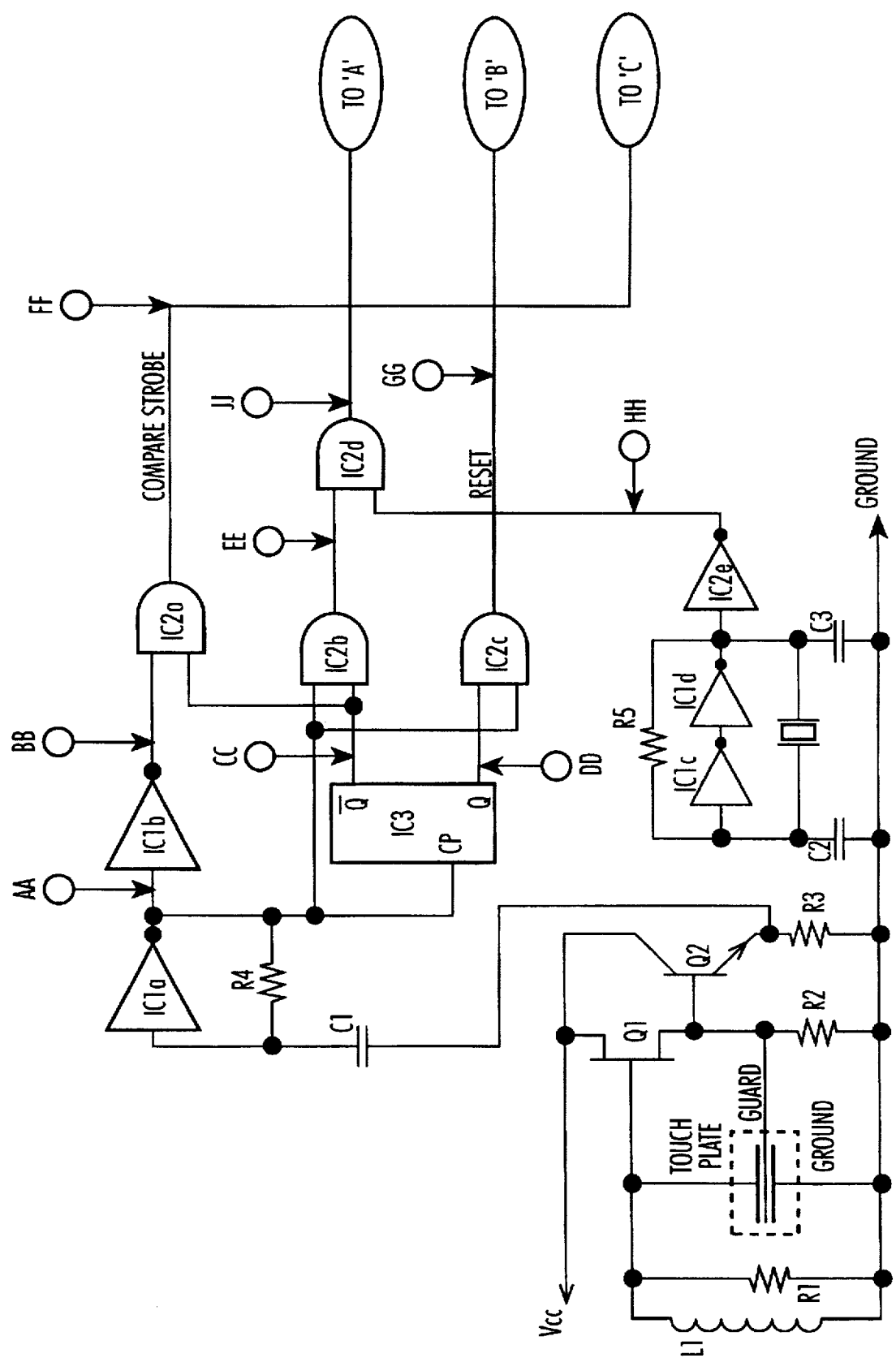
Figure 7C:
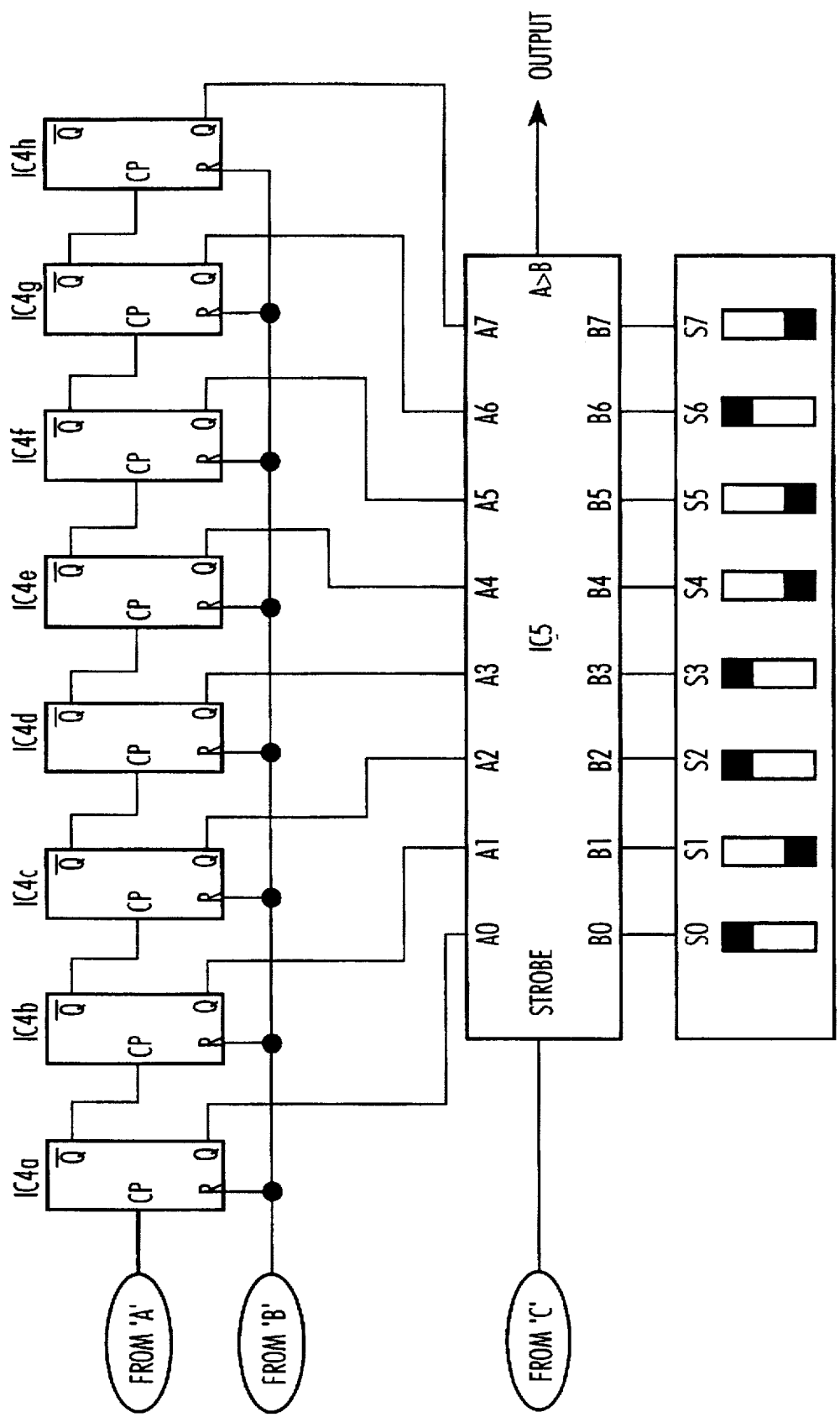
Figure 7D:
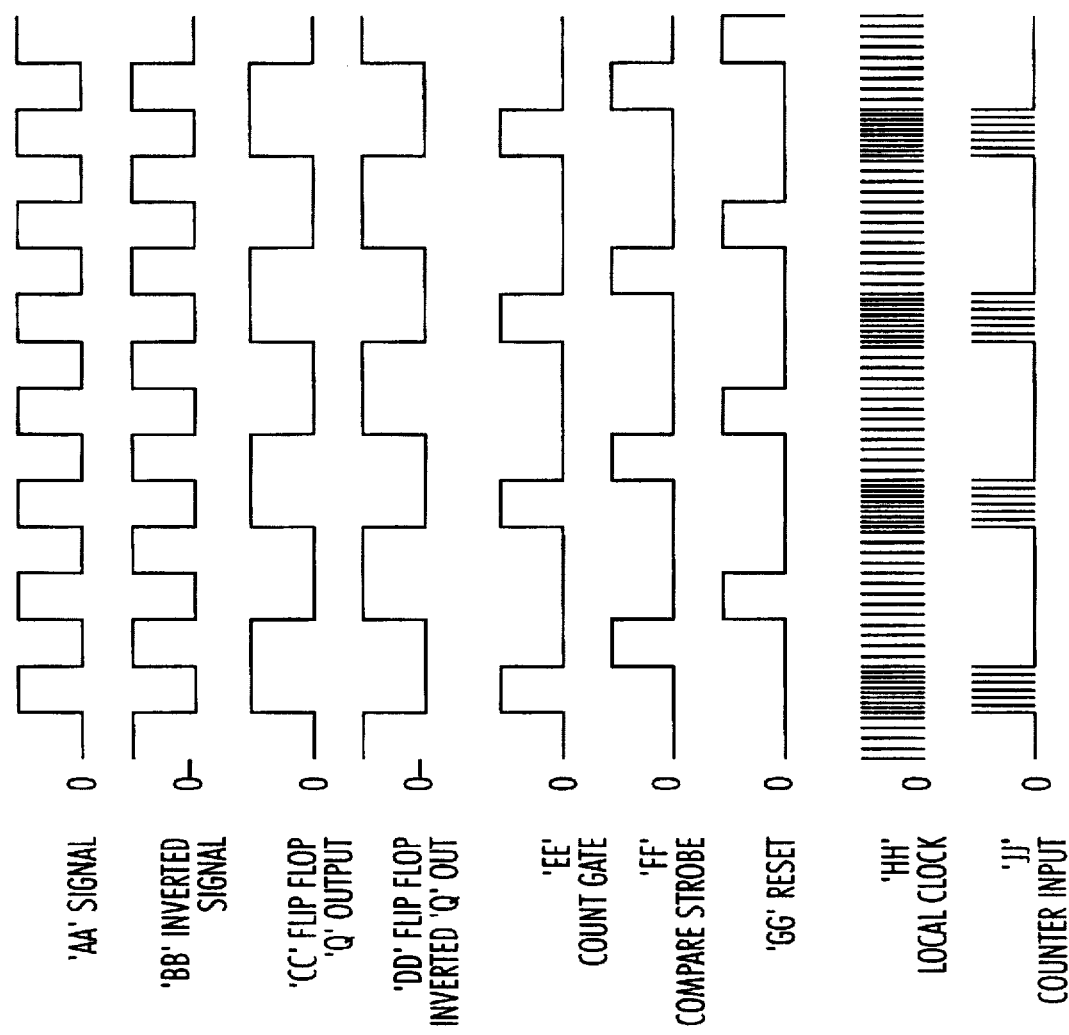

FIGS. 7(a)–(d) illustrate a self excited sensor structure using frequency comparison detection circuitry. This circuit detects the change in frequency of the AC output signal from the buffer amplifier as an object approaches the sensing region. FIG. 7(a) is a schematic block diagram of the circuit and shows the four functional elements: an oscillator incorporating the sensor structure, a frequency counter, a binary comparator, and a binary reference. FIGS. 7(b)&(c) are a circuit level implementation of the block diagram shown in FIG. 7(a). FIG. 7(d) shows the signal waveform at various points (such as "AA", "BB", and the like) in the circuit shown in FIG. 7(b)&(c). In FIG. 7(b), the sensor, inductor L1, transistor Q1, and resistors R1 & R2 form a Colpitts oscillator. Transistor Q2 and resistor R3 form a buffer amplifier to isolate the oscillator from following the subsequent circuit loads. Circuit elements IC1a through IC1e are logic level inverters. Inverter IC1a is biased with resistor R4 to operate as a linear amplifier. The signal output of transistor Q2 is applied to the input of IC1a through capacitor C1, a DC blocking capacitor. The positive and negative excursions of the signal drive the output of inverter IC1a to saturation. This shapes the normally rounded oscillator output waveform to a square waveform at point "AA" (see FIG. 7(d)) in the circuit. Inverter IC1b inverts the waveform, and generates the inverse waveform at point "BB" (see FIG. 7(d)). The output of inverter IC1a is also used as a clock input to IC3, a flip-flop. The outputs of the flip-flop, IC3, at Q and inverse Q, are at half the frequency of the input, and are shown at "CC" and "DD" in FIG. 7(b). Circuit elements IC2a to IC2d are logical AND circuits. Signals "BB" and "DD" in FIG. 7(b) are ANDed in IC2a to generate the COMPARE signal at "FF" (see FIG. 7(d)). Signals "AA" and "CC" are ANDed in IC2b to generate the GATE signal "EE" (note that the duration or width of "EE" is equal to half the cycle of the output signal at transistor Q2's emitter). Signals "AA" and "DD" are ANDed in IC2c to generate the RESET signal at "GG". IC1e buffers the oscillator from circuit loading. The oscillator output is shown at "HH" (see FIG. 7(d)). The frequency of the oscillator signal "HH" is about 1–200 times the frequency of the sensor oscillator. Signals "EE" and "HH" are ANDed by IC2d to generate the signal "JJ". The number of cycles in "JJ" is proportional to the period of the touch sensor oscillator (see FIG. 7(d)).

IC4 forms an 8 stage binary ripple counter made from master-slave flip-flops IC4a through IC4h (see FIG. 7(c)). The signal to be counted is applied to CP of IC4a, and a master reset line is provided. The output which represents the number of pulses counted, are the Q outputs of IC4a through IC4h and are presented to the A0 to A7 inputs to the magnitude comparator IC5. The binary reference is generated by a bank of switches S0 to S7 and supplied to inputs B0 to B7 in IC5.

The sequence of operation is as follows. A detection cycle starts with the reset signal at "GG" going high (all the logic described is positive, i.e., active when high) clearing the counter. At this point the comparator and the counting sequence are disabled. Next the count gate signal, "EE", is activated allowing pulses to be applied to the counter at "JJ". At this point the comparator is still disabled. When the count gate signal goes low the pulse count is held on the pulse counter Q outputs. Next the compare strobe at "FF" becomes active. The comparator IC5 compares the values from the counter and reference. If the counter (input A) is less than or equal to the reference (input B) the output will go high indicating the presence of an object in the sensing range. When the compare strobe goes low the output is latched by the magnitude comparator, IC5.

The frequency of the touch sensor oscillator decreases as an object approaches, or in other words, the oscillator period increases. The width of the count gate signal, "EE", is directly proportional to the touch sensor oscillator period, and therefore, the count gate width increases as an object approaches. The number of cycles from the crystal oscillator applied to the counter input is directly proportional to the width of the count gate signal, and therefore, the counter output increases when an object approaches. The digital reference number is predetermined for any particular application and can be set based on a number of factors such as the distance at which the presence of an object should trigger the output of the circuit, the touch sensor oscillator frequency, and the crystal oscillator frequency.

Figure 8A:
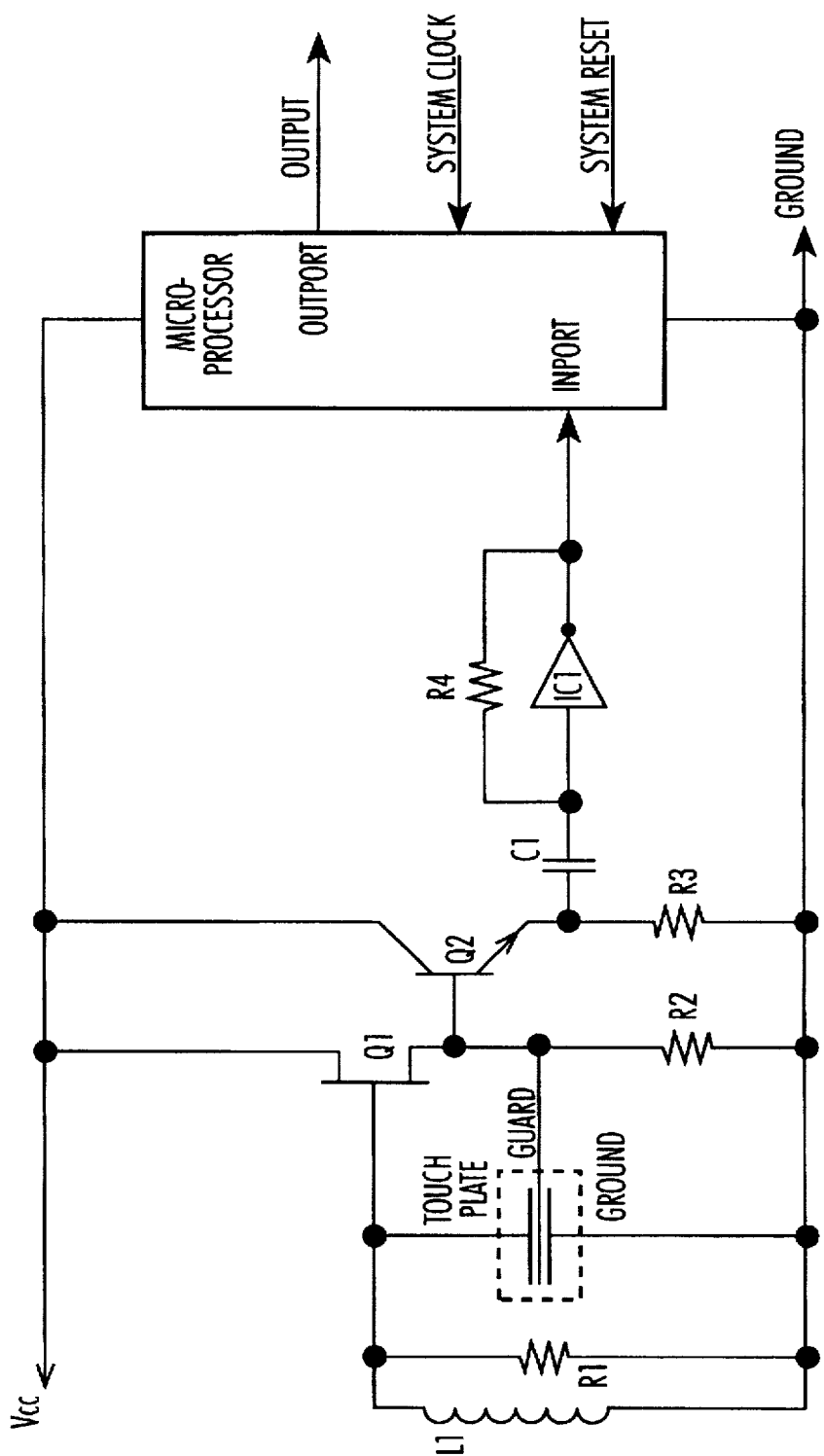
FIGS. 8(a) & (b) show a microprocessor-based implementation of a self excited sensor structure using frequency comparison detection circuitry.
Figure 8B:
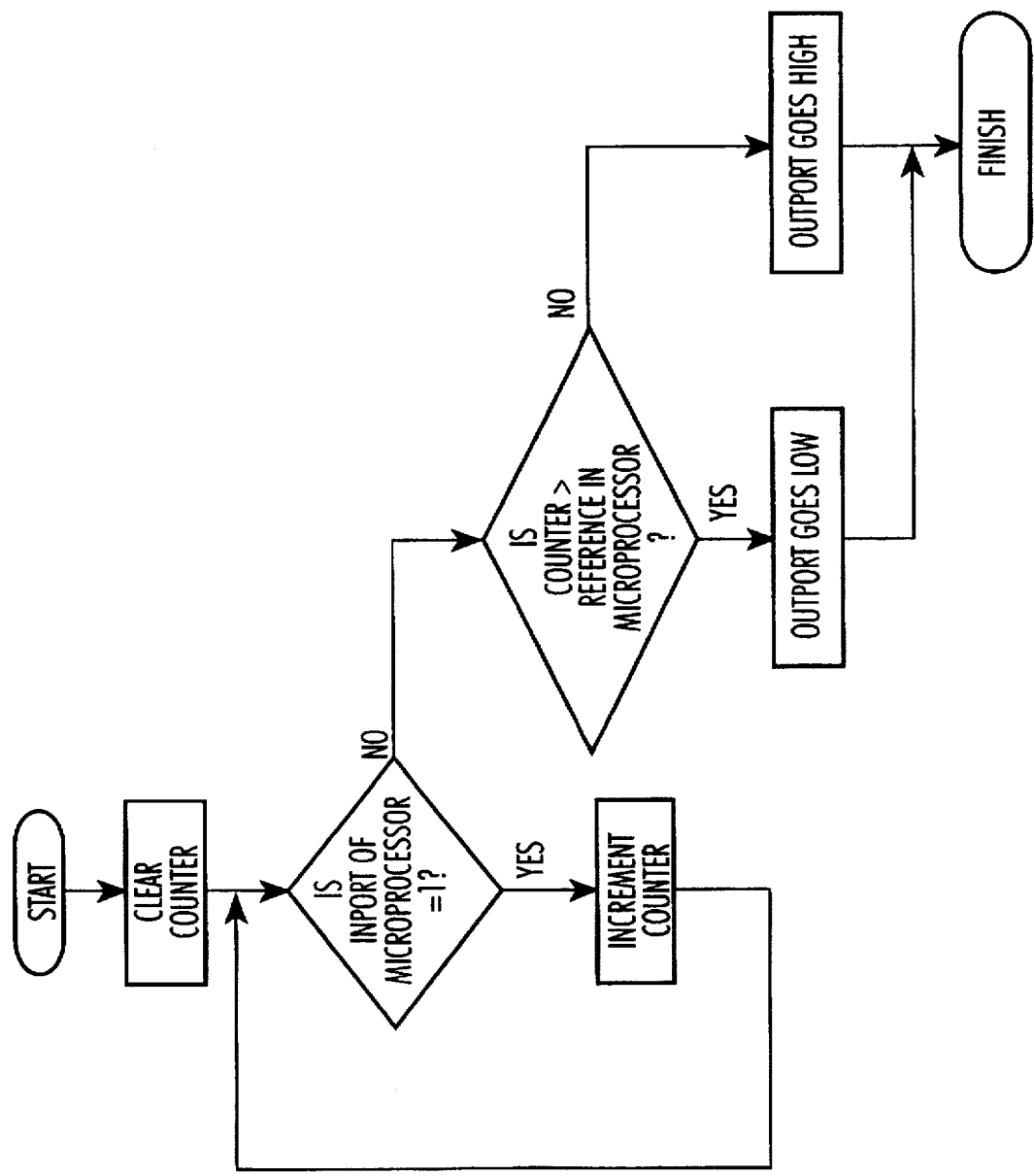

FIGS. 8(a)&(b) illustrate a microprocessor-based implementation of a self excited sensor structure using frequency comparison detection circuitry. The touch sensor, the inductor L1, the transistor Q1, and resistors R1 and R2 form a Colpitts oscillator. The frequency of the oscillator is determined by the inductor L1 and the capacitance of the sensor. Transistor Q1 and resistor R3 form a buffer amplifier and C1 is a DC blocking capacitor. Circuit element IC1 is an inverting gate biased by resistor R$ for semilinear amplification. The input to IC1 is great enough to fully saturate the output, thereby driving the inport to the microprocessor (see FIG. 8(a)) with a square wave. The system clock to the microprocessor supplies the reference signal. A counter in the microprocessor measures the period for the signal at the import is high and compares that to the reference signal (see the flow chart in FIG. 8(b)). When the counter is less than or equal to the reference signal (i.e., when the time period for the import signal to the microprocessor is less than or equal to half the time period of the reference signal) the signal at the outport to the microprocessor goes high indicating the presence of an object in the sensing region.

In either the self-excited mode or the externally excited mode, the oscillating frequency is not critical and could range from several kilohertz (kHz) to hundreds of megahertz (MHz). The shape of the waveform generated by the oscillator in either mode is also not critical and good performance may be obtained using a sinusoidal, square or ramp waveform. In a preferred embodiment, depending on the particular detection circuit chosen, sinusoidal or square exciting waveforms with frequencies from 10 kHz–10 MHz may be employed.

The thickness of the insulating layers is set by the requirements of a particular application for the sensor, rather than by fundamental theoretical or design considerations. The thicknesses of the conductive layers (i.e., the guard layer 15 and the touch plate 25) are typically between 0.1 to 10 mils.

With self excited circuits the separating first and second insulating layers 10, 20 are kept thin (typically around 10–15 mils). The ratio of their thicknesses will determine the ratio of the resulting capacitors, and this ratio may be adjusted to suit the oscillator circuit.

In externally excited circuits it is desirable to make the first insulating layer 10 between the ground plane 5 and the guard layer 15 as thick as possible. This reduces signal losses between the guard layer 15 and the ground plane 5. The insulator between the guard layer 15 and the touch plate 25 should be as thin as possible (around 5 mils) to maximize coupling. This permits the signal driving the guard layer electrode 15 to have the same amplitude and phase as the signal to the touch plate 25. When the guard layer 15 is driven by a external oscillator, the ground plane 5 to guard layer 15 insulator thickness is not important, and the guard layer 15 to touch plate 25 insulator thickness can be adjusted to achieve a convenient drive level at the buffer input (typically around 2.5–5.0 V peak-to-peak).

The choice between using an externally excited proximity sensor with amplitude comparison or phase and amplitude comparison or using a self excited proximity sensor with amplitude comparison or frequency comparison is determined primarily by application requirements and cost/performance (i.e., sensitivity) tradeoffs.

The self excited proximity sensor with amplitude comparison is generally best suited for applications requiring only one sensor. Such a sensor provides good sensitivity while at the same time using a small number of components, thus keeping costs low. If the resources of a microcontroller are available (as is likely in an automobile) it can be used to implement the frequency comparison version with relatively few additional components. This also eliminates the need for the rectifier/comparator circuits. Since the self excited proximity sensor uses an inductor, a relatively expensive component, this sensor is not cost effective for multiple sensor applications.

The externally excited proximity sensor with amplitude comparison is best suited for applications with multiple sensors. The increased number of components can be offset by using one oscillator to drive multiple sensors, and the rectifier/amplifier and comparator/reference stages can be multiplexed to serve several sensors. The externally excited proximity sensor with phase and amplitude comparison yields the greatest sensitivity but also has the highest number of component parts (i.e., increased costs).

While there has been described what is at present considered to be a preferred embodiment of this invention, it will be clear to those skilled in the art that various changes and modifications may be made without departing from the invention, and it is, therefore, intended to cover all such changes and modifications as fall within the true spirit and scope of this invention.

What is claimed is:

1. A capacitive sensor for detecting the presence of an object in a sensing region comprising:

a ground plane;

a first insulating layer disposed on said ground plane;

a guard layer disposed on said first insulating layer;

a second insulating layer disposed on said guard layer;

a touch plate disposed on said second insulating layer;

an oscillator means for supplying an excitation signal to said touch plate; and a driving means for supplying an excitation signal to said guard layer such that the capacitance between said guard layer and said ground plane substantially cancels the capacitance between said touch plate and said ground plane.

2. The sensor as defined in claim 1 wherein said driving means comprises a buffer amplifier which electrically isolates said touch plate from said guard layer.

3. The sensor as defined in claim 1 further comprising means for measuring the change in amplitude of the output voltage from said sensor and wherein the presence of an object in the sensing region is detected using said means for measuring.

4. The sensor as defined in claim 1 further comprising means for measuring the change in amplitude of the output voltage from said sensor and means for measuring the change in phase of the output voltage from said sensor and wherein the presence of an object in the sensing region is detected using said means for measuring the change in amplitude and said means for measuring the change in phase.

5. The sensor as defined in claim 1 wherein said ground plane is at least as large as said guard layer and extends beyond it in all dimensions.

6. The sensor as defined in claim 1 wherein said first insulating layer is at least as large as said guard layer.

7. The sensor as defined in claim 1 wherein said guard layer is substantially the same size as said touch plate.

8. The sensor as defined in claim 1 wherein said touch plate and said guard layer are conducting and have a thickness between 0.1–10 mils.

9. The sensor as defined in claim 1 wherein said oscillator means generates a sinusoidal, square, or ramp waveform with a frequency of 10 kHz–10 MHz.

10. A capacitive sensor for detecting the presence of an object in a sensing region comprising:

a ground plane;

a first insulating layer disposed on said ground plane;

a guard layer disposed on said first insulating layer;

a second insulating layer disposed on said guard layer;

a touch plate disposed on said second insulating layer; and an inductor in parallel to said sensor, said inductor and said sensor forming an oscillator means to excite said sensor.

11. The sensor as defined in claim 10 further comprising means for measuring the change in amplitude of the output voltage from said sensor and wherein the presence of an object in the sensing region is detected using said means for measuring.

12. The sensor as defined in claim 10 further comprising means for measuring the change in frequency of the output voltage from said sensor and wherein the presence of an object in the sensing region is detected using said means for measuring.

13. The sensor as defined in claim 12 wherein said means measuring the change in frequency of the output voltage from said sensor comprises a microprocessor.

14. The sensor as defined in claim 10 wherein said ground plane is at least as large as said guard layer and extends beyond it in all dimensions.

15. The sensor as defined in claim 10 wherein said first insulating layer is at least as large as said guard layer.

16. The sensor as defined in claim 10 wherein said guard layer is substantially the same size as said touch plate.

17. The sensor as defined in claim 10 wherein said touch plate and said guard layer are conducting and have a thickness between 0.1–10 mils.

18. A method for detecting the presence of an object in a sensing region comprising:

providing a ground plane;
providing a first insulating layer on said ground plane;
providing a guard layer on said first insulating layer;
providing a second insulating layer on said guard layer;
providing a touch plate on said second insulating layer;
exciting said touch plate by an oscillator means;
exciting said guard layer by a driving means such that the capacitance between said guard layer and said ground plane substantially cancels the capacitance between said touch plate and said ground plane.

19. The method as defined in claim 18 further comprising choosing said driving means to be a buffer amplifier that electrically isolates said touch plate from said guard layer.

20. The method as defined in claim 18 further comprising the step of measuring the change in amplitude of the output voltage from said sensor in order to determine the presence of an object in the sensing region.

21. The method as defined in claim 18 further comprising the step of measuring the change in amplitude and phase of the output voltage from said sensor in order to determine the presence of an object in the sensing region.

22. A method for detecting the presence of an object in a sensing region comprising:

providing a ground plane;
providing a first insulating layer on said ground plane;
providing a guard layer on said first insulating layer;
providing a second insulating layer on said guard layer;
providing a touch plate on said second insulating layer;
placing an inductor in parallel to said sensor, and exciting said sensor by an oscillator means formed by said inductor and said sensor.

23. The method as defined in claim 22 further comprising the step of measuring the change in amplitude of the output voltage from said sensor in order to determine the presence of an object in the sensing region.

24. The method as defined in claim 22 further comprising the step of measuring the change in frequency of the output voltage from said sensor in order to determine the presence of an object in the sensing region.

25. The method as defined in claim 24 wherein said step of measuring the change in frequency of the output voltage from said sensor is performed using a microprocessor.

\* \* \* \* \*